United States Patent
Ma et al.

(10) Patent No.: US 9,466,524 B2
(45) Date of Patent: Oct. 11, 2016

(54) METHOD OF DEPOSITING METALS USING HIGH FREQUENCY PLASMA

(71) Applicant: Applied Materials, Inc., Santa Clara, CA (US)

(72) Inventors: Paul F. Ma, Santa Clara, CA (US); Guojun Liu, San Jose, CA (US); Annamalai Lakshmanan, Fremont, CA (US); Dien-Yeh Wu, San Jose, CA (US); Anantha K. Subramani, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 175 days.

(21) Appl. No.: 13/742,596

(22) Filed: Jan. 16, 2013

(65) Prior Publication Data
US 2013/0196507 A1    Aug. 1, 2013

Related U.S. Application Data

(60) Provisional application No. 61/592,986, filed on Jan. 31, 2012.

(51) Int. Cl.
| | |
|---|---|
| *H01L 21/44* | (2006.01) |
| *H01L 21/768* | (2006.01) |
| *C23C 16/34* | (2006.01) |
| *C23C 16/455* | (2006.01) |
| *H01L 21/285* | (2006.01) |

(52) U.S. Cl.
CPC ........ H01L 21/76838 (2013.01); C23C 16/34 (2013.01); C23C 16/45542 (2013.01); H01L 21/28562 (2013.01); H01L 21/76841 (2013.01); H01L 21/76862 (2013.01)

(58) Field of Classification Search
CPC .................. H01L 21/76838; H01L 21/76862; H01L 21/28562; H01L 21/76841; H01L 21/768; C23C 16/34; C23C 16/45542
See application file for complete search history.

(56) References Cited

U.S. PATENT DOCUMENTS

| | | | |
|---|---|---|---|
| 6,025,264 A | | 2/2000 | Yew et al. |
| 6,265,311 B1 * | | 7/2001 | Hautala et al. ............... 438/680 |
| 6,656,831 B1 | | 12/2003 | Lee et al. |
| 7,072,028 B2 | | 7/2006 | Powell et al. |
| 7,307,028 B2 | | 12/2007 | Goto et al. |
| 7,456,939 B2 | | 11/2008 | Powell et al. |
| 7,580,119 B2 | | 8/2009 | Powell et al. |
| 2004/0082169 A1 | | 4/2004 | Chooi et al. |

(Continued)

FOREIGN PATENT DOCUMENTS

| | | |
|---|---|---|
| EP | 1697727 | 10/2007 |
| KR | 10-20010078086 | 8/2001 |

OTHER PUBLICATIONS

International Search Report for PCT/US2013/024107, 12 pages mailed on May 15, 2013.

(Continued)

*Primary Examiner* — Charles Garber
*Assistant Examiner* — Abdulfattah Mustapha
(74) *Attorney, Agent, or Firm* — Servilla Whitney LLC

(57) ABSTRACT

Methods for depositing metal layers, and more specifically TaN layers, using CVD and ALD techniques are provided. In one or more embodiments, the method includes sequentially exposing a substrate to a metal precursor, or more specifically a tantalum precursor, followed by a high frequency plasma.

15 Claims, 2 Drawing Sheets

(56) References Cited

U.S. PATENT DOCUMENTS

| | | |
|---|---|---|
| 2005/0011757 A1* | 1/2005 | Noda .................. 204/298.11 |
| 2005/0164487 A1* | 7/2005 | Seutter ................. C23C 16/34 438/618 |
| 2006/0251812 A1 | 11/2006 | Kang et al. |
| 2007/0227668 A1* | 10/2007 | Iizuka .................. 156/345.48 |
| 2010/0006031 A1* | 1/2010 | Choi et al. ............. 118/723 R |
| 2010/0081285 A1* | 4/2010 | Chen et al. .............. 438/710 |
| 2011/0236600 A1* | 9/2011 | Fox ..................... H01L 21/0214 427/579 |

OTHER PUBLICATIONS

PCT International Search Report and Written Opinion in PCT/US2013/024107, mailed Aug. 14, 2014, 8 pages.

* cited by examiner

METHOD OF DEPOSITING METALS USING HIGH FREQUENCY PLASMA

CROSS-REFERENCE TO RELATED APPLICATIONS

This application claims the benefit of U.S. Provisional Application No. 61/592,986, filed Jan. 31, 2012.

BACKGROUND

Embodiments of the present invention generally relate to methods for depositing metals. Specific embodiments of the invention are directed to methods for the deposition of tantalum nitride (TaN) using CVD or ALD techniques.

Atomic Layer Deposition (ALD) deposited tantalum nitride (TaN) is a promising candidate for copper barrier, especially for very fine structures. The deposition of TaN as a copper barrier can be performed on bare substrates or various underlayers, including, but not limited to low-k dielectrics. Tantalum nitride films are used, for example, in front end of line (FEOL) processes as an etch stop on top of a work function material to protect gate materials and as a barrier for aluminum deposition. TaN is also used in back end of line (BEOL) processes as a copper barrier to prevent diffusion of copper into the adjacent layer.

Generally, a larger amount of tantalum results in better adhesion of a subsequently deposited layer. In processing TaN, higher power plasma is known to damage the TaN layer. Such damage can include, higher capacitances, increase dielectric constant resulting in greater leakage currents, etching of carbon in low-k films, collapsing of the pores in low-k films and penetration through high-k films and interface layer. Damage to the underlying layers is a concern in processes that include, but are not limited to, metal gate deposition, formation of a treatment film on a low K films, and silicide deposition. In metal gate deposition, the substrate may be Si and may include a thin oxide layer deposited on the Si substrate having a thickness of less than about 10 Å, a high K oxide disposed on the thin oxide layer having a thickness less than about 20 Å, an optional cap layer having a thickness in the range from about 10 Å to about 20 Å and a metal gate layer such as a tantalum or cobalt metal layer. In processes for providing a treatment film on a low K film, the substrate includes a low K material, a barrier layer deposited on the substrate followed by a metal deposition on the barrier layer or treatment of the barrier layer. The barrier layer in such processes is typically thin. In silicide deposition, the substrate typically includes Si and includes a metal silicide layer disposed thereon and cleaned and a barrier layer is disposed on the metal silicide layer.

There is an ongoing need to develop methods of depositing TaN films having one or more of better performance, higher film density, lower resistivity, less or no plasma damage and uniform barrier coverage and stop coverages.

SUMMARY

One or more embodiments of the invention are directed to methods of depositing a metal film on a substrate. The methods comprise sequentially exposing the substrate to a metal precursor and a high frequency plasma.

In some embodiments, the high frequency plasma comprises one or more of argon, hydrogen, ammonia, helium and nitrogen. In some embodiments, the high frequency plasma has a frequency of about 40 MHz. In one or more embodiments, the high frequency plasma has a pressure in the range of about 1 Torr to about 20 Torr. In one or more embodiments, the high frequency plasma is a capacitively coupled plasma. In one or more embodiments, the high frequency plasma has a power in the range of about 200 watts to about 1200 watts.

In one or more embodiments, the metal precursor is a tantalum precursor. In some embodiments, the tantalum precursor comprises one or more of pentakis(dimethylamino)tantalum (PDMAT), tantalum fluoride, tertbutylimido-tris(ethylmethylamino)tantalum (TBTEMT), tertbutylimido-tris(diethylamino)tantalum (TBTDEAT), tertbutylimido-tris(dimethylamino)tantalum (TBTDMAT), tertiaryamylimido-tris(dimethylamino)tantalum (TAIMATA), tertiaryamylimido-tris(diethylamino)tantalum, tertiaryamylimido-tris(methylethylamino)tantalum, pentakis(ethylmethylamino)tantalum (PEMAT), pentakis(diethylamido)tantalum (PDEAT), plasmas thereof, derivatives thereof, or combinations thereof. In specific embodiments, the tantalum precursor is pentakis(dimethylamido)tantalum (PDMAT).

Some embodiments further comprise heating the substrate to a temperature in the range of about 150° C. to about 350° C. Some embodiments further comprise adjusting the distance between the substrate and the gas distribution plate. In some embodiments, the distance between the substrate and the gas distribution plate is in the range of about 50 mil to about 800 mil. In specific embodiments, the distance between the substrate and the gas distribution plate is in the range of about 300 mil and about 580 mil.

In some embodiments, the resultant film has a lower resistivity than a similar film processed without the high frequency plasma. In one or more embodiments, the resultant film has a higher density than a similar film processed without the high frequency plasma.

Additional embodiments of the invention are directed to methods of depositing a tantalum nitride film on a surface of a substrate. The substrate is placed in a processing chamber comprising a gas distribution plate. The surface of the substrate is positioned a distance from the gas distribution plate. The substrate is sequentially exposed to a tantalum precursor and a high frequency plasma. Some embodiments further comprise adjusting the distance between the substrate surface and the gas distribution plate, the adjusted distance being in the range of about 300 mil and about 580 mil. One or more embodiments further comprise heating the substrate.

In one or more specific embodiments, the tantalum precursor comprises one or more of pentakis(dimethylamino)tantalum (PDMAT), tantalum fluoride, tertbutylimido-tris(ethylmethylamino)tantalum (TBTEMT), tertbutylimido-tris(diethylamino)tantalum (TBTDEAT), tertbutylimido-tris(dimethylamino)tantalum (TBTDMAT), tertiaryamylimido-tris(dimethylamino)tantalum (TAIMATA), tertiaryamylimido-tris(diethylamino)tantalum, tertiaryamylimido-tris(methylethylamino)tantalum, pentakis(ethylmethylamino)tantalum (PEMAT), pentakis(diethylamido)tantalum (PDEAT), plasmas thereof, derivatives thereof, or combinations thereof and the high frequency plasma comprises one or more of argon, hydrogen, ammonia, helium and nitrogen, and the high frequency plasma has a frequency in the range of about 20 MHz and about 120 MHz.

Further embodiments of the invention are directed to methods of depositing a tantalum nitride film on a surface of a substrate. The substrate is placed in a processing chamber comprising a gas distribution plate. The gas distribution plate comprises at least one first reactive gas injector and at least one second reactive gas injector. The at least one first reactive gas injector provides a tantalum precursor to the deposition region and the at least one second reactive gas injector providing a high frequency plasma to the deposition region. The at least one first reactive gas injector is separated from the at least one second reactive gas injector by one or more vacuum ports and one or more purge gas injectors. A portion of the substrate is passed across the gas distribution plate in a first direction so that the portion of the substrate is sequentially exposed to the tantalum precursor followed by the high frequency plasma.

As used herein, the terms "treatment," "treat" or "treating" a layer or substrate shall refer to exposure of that layer or substrate to a hydrogen plasma as otherwise described herein. Such exposure may be cyclical or may be in short durations that may be repeated. The duration of exposure may be constant or may vary from each exposure to the next. Other conditions during exposure may also vary or may be constant.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention pertain to methods of depositing a metal layer on a semiconductor substrate. More specifically, embodiments described herein pertain to deposition of metal precursor layers and treatment of those layers with a hydrogen plasma to provide a pure metal layer or a metal layer with reduced impurities and/or organic components. More particular embodiments include selectively vary the ion energy of the incoming hydrogen species, e.g. hydrogen radicals, used in hydrogen plasma treatment.

ALD deposited tantalum nitride (TaN) is a promising candidate for copper barrier, especially for very fine structure. The inventors have surprising found that high frequency, such as 40 MHz, RF direct plasma treatment can densify the film, lower the resistivity and enhance the barrier properties. High frequency plasma, 40 MHz or even higher frequencies such as 60 MHz, 80 MHz or 120 MHz can provide high density plasma treatment without causing damage to the substrate film.

Embodiments of the invention provide an effective way to lower the resistivity of TaN films and enhance the barrier properties. Additionally, the plasma treatment has surprisingly been found to enhance the interface quality of the film before and after TaN deposition. More specifically, it has be found that thigh frequency RF plasma treatment improves the interface between TaN and the following layer (e.g., copper seed layer, metal wetting layer such as cobalt or ruthenium before the copper seed layer). Embodiments of the invention have application to any CVD or ALD metallic film process which has the need of lowering resistivity and densifying the film.

One or more embodiments of the methods described herein may be incorporated into chemical vapor deposition (CVD) and/or atomic layer deposition (ALD) processes, using hardware typically associated with such processes.

Figure 1:
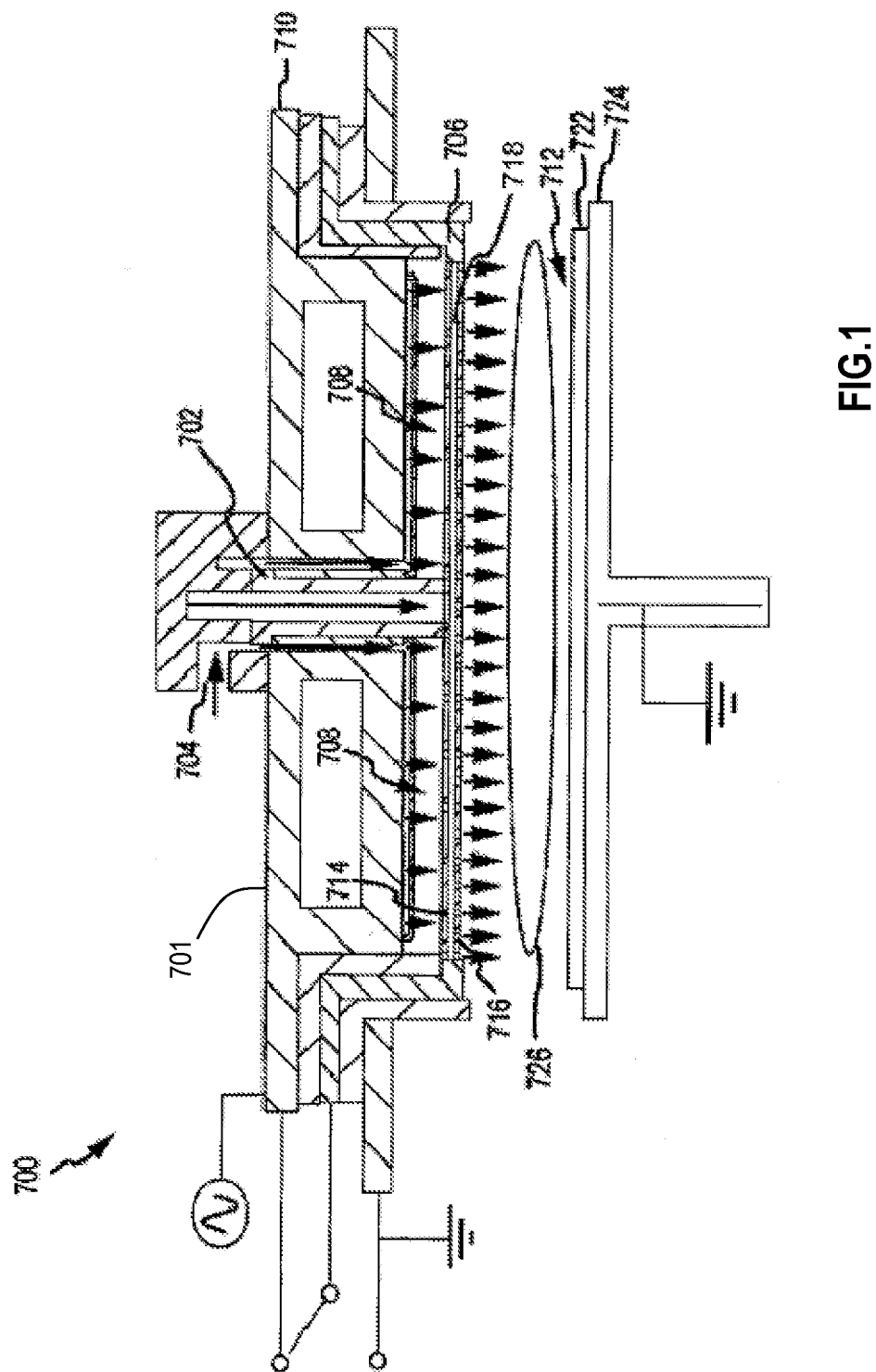
FIG. 1 illustrates an exemplary processing chamber for use with one or more embodiments of the present invention.

Typical ALD and CVD reaction chambers that may be used various embodiments of the invention are suitable for deposition of layers on a substrate as described herein and include a plasma reactor for supplying plasma to the reaction chamber (remote plasma) or for generating the plasma within the reaction chamber (direct plasma). FIG. 1 shows a simplified cross-sectional schematic of a processing chamber 700 in accordance with one or more embodiments of the invention. FIG. 1 shows a processing chamber 700 with a showerhead for delivering gases (e.g., precursors, purge gases) into the deposition region 712. Those skilled in the art will understand that a showerhead as shown is merely one possible option for gas delivery. Other embodiments have chambers with vortex lids, remote plasma lids, direct plasma lids, hybrid lids and spatial ALD injectors. For ease of description, these various types of gas injection systems are referred to as a gas distribution plate 701.

The gas distribution plate 701 shown in FIG. 1 is configured with two inlet ports 702 and 704. The first inlet port 702 is coaxial with the center of the showerhead and defines a flow path for at least a first precursor down the center of the showerhead and then laterally behind the faceplate 706. The precursor exits the showerhead into the deposition chamber behind selected openings in the faceplate.

The second inlet port 704 may be configured to flow a plasma gas around the first port 702 and into a region 708 between the gasbox 710 and the faceplate 706. The plasma gas may then flow from region 708 through selected openings in the faceplate 706 before reaching the deposition region 712. This type of arrangement, in which the plasma is generated outside of the deposition region 712, may be referred to as a remote plasma. As FIG. 1 shows, the faceplate 706 has two sets of openings: a set of first openings 714 that provide fluid communication between the region 708 and the deposition region 712, and a second set of openings 716 that provide fluid communication between the first inlet port 702, the faceplate gap 718 and the deposition region 712. Again, those skilled in the art will understand that this is merely one possible arrangement. The deposition gases can be provided to the deposition region 712 through the same set of openings in the gas distribution plate, or through the same funnel shaped vortex chamber.

The faceplate 706 may be a dual-channel faceplate that keeps the precursor and plasma gas or species independent until they leave the gas distribution plate for the deposition region. For example, the precursors may travel around openings 714 in the faceplate gap 718 before exiting the gas distribution plate through openings 716. Barriers such as a cylindrical port may surround the openings 714 to prevent the precursor from exiting through these openings. Likewise, the plasma gas or species traveling though openings 714 cannot flow across the faceplate gap 718 and out second openings 716 into the deposition region.

In one or more embodiments, the faceplate 706 and pedestal 724 may form electrodes to generate a capacitively coupled plasma 726 in the deposition region above the substrate 722. Embodiments of this sort may be referred to as direct plasma chambers or direct plasma processing, or the like. A direct plasma provide a greater degree of ionization as there is less opportunity for the ionized species in the plasma to become deactivated while flowing into the chamber.

The system 700 may also be configured to generate a second plasma 728 in the region 708 behind the face plate. This plasma 728 may be generated by applying an RF electric field between the gasbox 710 and the faceplate 706, which form the electrodes for the plasma. This plasma may be made from the plasma gas that flows into region 708 from the second inlet port 704. The second plasma 728 may be used to generate reactive plasma species from the plasma gas.

The processing chamber illustrated in FIG. 1 can be used as a CVD reactor in which two processing gases (or plasmas) are flowed into the deposition region 712 simultaneously, or as an ALD chamber in which the gases are flowed into the chamber sequentially so that reactions occur substantially only on the substrate surface only.

One or more embodiments of the invention are directed to methods of depositing a metal film on a substrate by sequentially exposing the substrate to a metal precursor and a high frequency plasma. As used in this specification and the appended claims, the term "high frequency plasma" means a plasma that has a frequency greater than 20 MHz. In some embodiments, the term "high frequency plasma" means a plasma with a frequency greater than about 40 MHz, 60 MHz, 80 MHz, 100 MHz or 120 MHz. It will be understood by those skilled in the art that the plasma has been generated by a power source having approximately or about the recited frequency.

The metal precursor employed can depend on the species being deposited. For example, a tantalum precursor is used to deposit tantalum and tantalum species on the substrate. In some embodiments, the metal precursor is a tantalum precursor. In some embodiments, the tantalum precursor comprises one or more of pentakis(dimethylamino)tantalum (PDMAT), tantalum fluoride, tertbutylimido-tris(ethylmethylamino)tantalum (TBTEMT), tertbutylimido-tris(diethylamino)tantalum (TBTDEAT), tertbutylimido-tris(dimethylamino)tantalum (TBTDMAT), tertiaryamylimido-tris(dimethylamino)tantalum (TAIMATA), tertiaryamylimido-tris(diethylamino)tantalum, tertiaryamylimido-tris(methylethylamino)tantalum, pentakis(ethylmethylamino)tantalum (PEMAT), pentakis(diethylamido)tantalum (PDEAT), plasmas thereof, derivatives thereof, or combinations thereof. In specific embodiments, the tantalum precursor is pentakis(dimethylamido)tantalum (PDMAT).

The plasma can include any suitable species depending on the film being deposited and the precursors. For example, deposition of a tantalum nitride film may benefit from a plasma including nitrogen. However, depending on the tantalum precursor being employed, it may not be necessary to have nitrogen in the plasma. In some embodiments, the high frequency plasma comprises one or more of argon, hydrogen, ammonia, helium and nitrogen. In specific embodiments, the high frequency plasma comprises a mixture of argon and hydrogen.

The frequency of the plasma can have a marked impact on the resultant film qualities. Higher power plasma generally create more damage in the deposited films. The inventors have found that increasing the frequency of the plasma minimizes the affects of the higher power plasma on the film. In some embodiments, substantially only one plasma frequency is used. As used in this specification and the appended claims, the term "substantially only one plasma frequency" means that the power source(s) used to generate the plasma are set to operate a single frequency. Those skilled in the art will understand that there is natural fluctuations in the frequency. Additionally, if more than one generator is employed, there will likely be a difference between the frequencies, even if all generators are set to the same frequency. In some embodiments, the high frequency plasma has a frequency of about 40 MHz. In some embodiments, the high frequency plasma has a frequency in the range of about 20 MHz to about 120 MHz. In some embodiments, the high frequency plasma is a capacitively coupled plasma.

The power level of the high frequency plasma can also be adjusted depending on the gaseous species and the desired film qualities. In some embodiments, the high frequency plasma has a power greater than about 100 watts, 200 watts, 300 watts, 400 watts, 500 watts, 600 watts, 700 watts, 800 watts or 900 watts. In some embodiments, the high frequency plasma has a power in the range of about 200 watts to about 1200 watts, or in the range of about 300 watts to about 1000 watts, or in the range of about 400 watts to about 600 watts.

The pressure of the reactant gas in the process chamber can also be adjusted depending on the desired properties of the plasma and the resultant film. The plasma pressure in some embodiments is in the range of about 0.01 torr to about 100 torr, or in the range of about 1 torr to about 20 torr, or in the range of about 0.1 torr to about 10 torr or about 1 torr or about 10 torr.

The temperature of the substrate, substrate surface or deposition region can have a marked impact on the quality of the deposited film. If the temperature is too high, the precursors can decompose instead of reacting with the substrate or film already on the substrate. If the temperature is too low, there may be no reaction. Accordingly, some embodiments of the method further comprise heating the substrate. The substrate can be heated by any number of suitable means known to those skilled in the art. For example, the pedestal 724 can be heated by an internal electrode or the chamber can be heated by a separate heating mechanism. Additionally, the reaction gases themselves can be heated. In one or more embodiments, the substrate is heated (or cooled) to a temperature in the range of about 100° C. to about 400° C., or in the range of about 150° C. to about 350° C., or in the range of about 200° C. to about 300° C.

The distance between the gas distribution plate and the substrate surface can also have an effect on the resultant film. If the distance is too small, the pattern of the showerhead is often transferred to the substrate as there is insufficient space for diffusion of the gases across the substrate surface. If the distance is too large, it can be harder to exchange gases in the deposition region. One or more embodiments of the invention further comprise adjusting the distance between the substrate and the gas distribution plate. In one or more embodiments, the distance between the substrate and the gas distribution plate is in the range of about 50 mil to about 800 mil, or in the range of about 75 mil to about 600 mil, or in the range 100 mil to about 500 mil, or in the range of about 125 mil to about 400 mil or in the range of about 300 mil to about 580 mil. In one or more embodiments, the distance between the substrate surface and the gas distribution plate is about 300 mil or about 580 mil.

In one or more embodiments, resultant film has a lower resistivity than a similar film processed without the high frequency plasma. In one or more embodiments, the resultant film has a resistivity about 10%, 20%, 30%, 40%, 50% or 60% lower than a similar film processed without the high frequency plasma.

In one or more embodiments, the resultant film has a higher density than a similar film processed without the high frequency plasma. In one or more embodiments, the resultant film has a density about 10%, 20%, 30%, 40%, 50% or 60% greater than a similar film processed without the high frequency plasma.

In some embodiments, a purge occurs after one or more of the precursor exposures. For example, the chamber, or reaction region adjacent the surface of the substrate, can be purged after exposure to the metal precursor, or after exposure to the high frequency plasma. In one or more embodiments, the chamber, or reaction region adjacent the surface of the substrate is purged after each exposure of the metal precursor and the high frequency plasma.

The deposition rate can be controlled to cause the film to relatively slowly or quickly. In some embodiments, the deposition rate is in the range of about 0.3 to about 0.8 Å/cycle, or in the range of about 0.4 to about 0.7 Å/cycle or in the range of about 0.5 to about 0.6 Å/cycle.

One or more embodiments of the invention comprises TDEAH as the first precursor and a plasma comprising a mixture of about 200 parts argon, 1000 parts ammonia, 2000 parts helium and 2300 parts hydrogen. The substrate is held at about 275° C. and a distance of about 580 mil from the gas distribution plate. The plasma pressure is about 1 torr and the plasma is generated at 600 watts or 400 watts at a frequency of about 40 MHz.

Plasma treatment has been used as a post-treatment process to densify films. In some embodiments, the plasma is used as a part of the ALD reaction process and is not needed as a post-deposition process. Therefore, it can also be said that one or more embodiments, do not require a plasma post-deposition process to densify the film.

Figure 2:
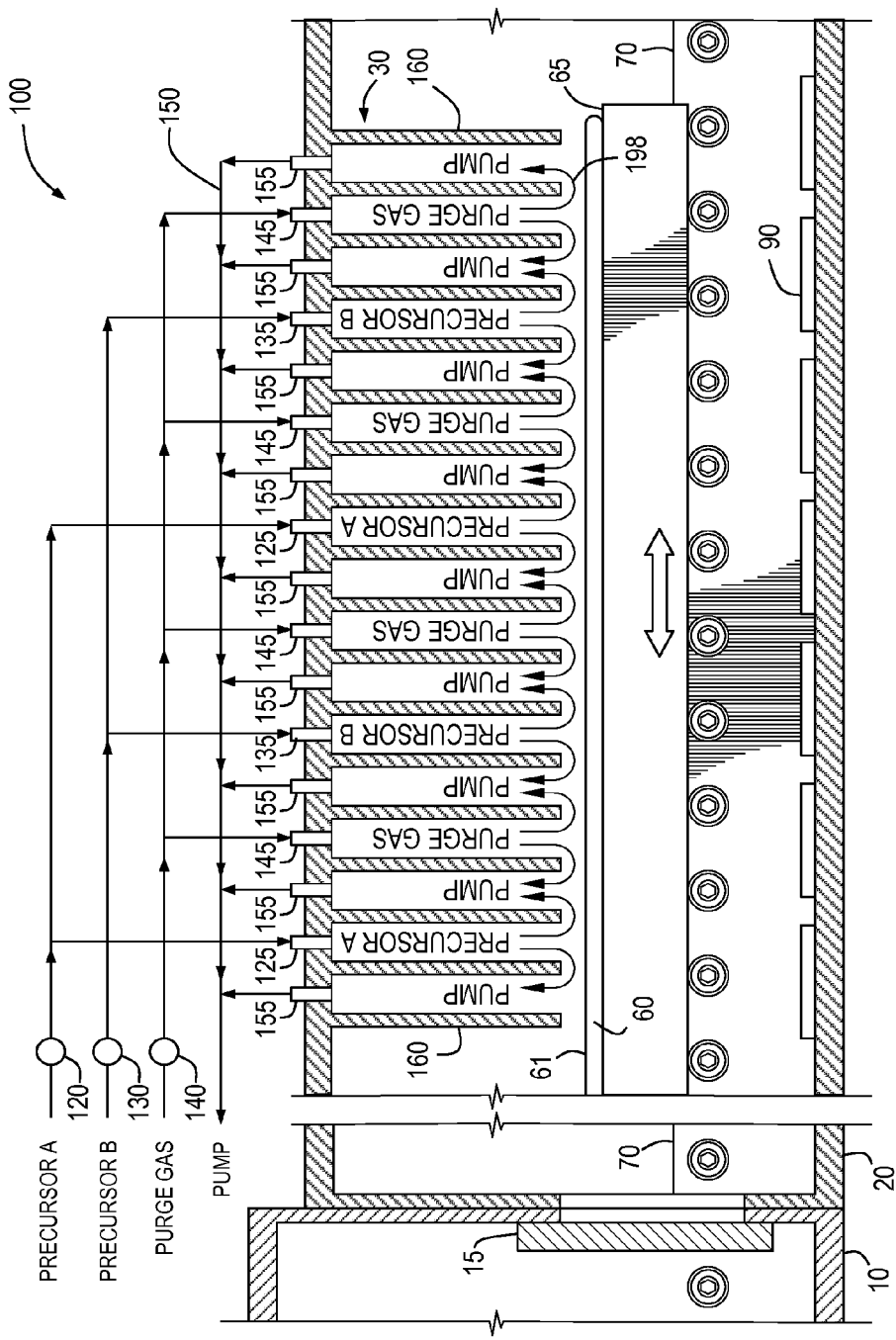
FIG. 2 illustrates an exemplary spatial processing chamber for use with one or more embodiments of the invention.

Another embodiment of the invention is directed to a method of depositing a tantalum nitride film on a surface of a substrate using, what can be referred to as spatial atomic layer deposition. FIG. 2 shows a cross-section of a spatial ALD chamber. FIG. 2 is a schematic cross-sectional view of an atomic layer deposition system 100 or reactor in accordance with one or more embodiments of the invention. The system 100 includes a load lock chamber 10 and a processing chamber 20. The processing chamber 20 is generally a sealable enclosure, which is operated under vacuum, or at least low pressure. The processing chamber 20 is isolated from the load lock chamber 10 by an isolation valve 15. The isolation valve 15 seals the processing chamber 20 from the load lock chamber 10 in a closed position and allows a substrate 60 to be transferred from the load lock chamber 10 through the valve to the processing chamber 20 and vice versa in an open position.

The system 100 includes a gas distribution plate 30 capable of distributing one or more gases across a substrate 60. The gas distribution plate 30 can be any suitable distribution plate known to those skilled in the art, and gas distribution plates described should not be taken as limiting the scope of the invention. The output face of the gas distribution plate 30 faces the first surface 61 of the substrate 60.

Substrates for use with the embodiments of the invention can be any suitable substrate. In some embodiments, the substrate is a rigid, discrete, generally planar substrate. As used in this specification and the appended claims, the term "discrete" when referring to a substrate means that the substrate has a fixed dimension. The substrate of some embodiments is a semiconductor wafer, such as a 200 mm or 300 mm diameter silicon wafer.

The gas distribution plate 30 comprises a plurality of gas ports configured to transmit one or more gas streams to the substrate 60 and a plurality of vacuum ports disposed between each gas port and configured to transmit the gas streams out of the processing chamber 20. In the embodiment of FIG. 1, the gas distribution plate 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 is configured to inject a continuous (or pulse) stream of a reactive precursor of compound A into the processing chamber 20 through a plurality of gas ports 125. The precursor injector 130 is configured to inject a continuous (or pulse) stream of a reactive precursor of compound B into the processing chamber 20 through a plurality of gas ports 135. The purge gas injector 140 is configured to inject a continuous (or pulse) stream of a non-reactive or purge gas into the processing chamber 20 through a plurality of gas ports 145. The purge gas is configured to remove reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, thereby avoiding cross-contamination between the precursors.

In another aspect, a remote plasma source (not shown) may be connected to the precursor injector 120 and the precursor injector 130 prior to injecting the precursors into the chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high intensity light source (e.g., UV energy), or exposure to an x-ray source. Exemplary remote plasma sources are available from vendors such as MKS Instruments, Inc. and Advanced Energy Industries, Inc. Additionally, the plasma can be generated at the end of the injector by including electrode materials in the partitions 160 so that the plasma is generated close to the surface of the substrate, thereby reducing the chance of deactivation of the plasma species.

The system 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The system 100 includes a plurality of partitions 160 disposed on the processing chamber 20 between each port. A lower portion of each partition extends close to the first surface 61 of substrate 60, for example about 0.5 mm from the first surface 61, This distance should be such that the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the invention. It will be understood by those skilled in the art that the gas distribution system shown is merely one possible distribution system and the other types of showerheads and gas distribution systems may be employed.

In operation, a substrate 60 is delivered (e.g., by a robot) to the load lock chamber 10 and is placed on a carrier 65. After the isolation valve 15 is opened, the carrier 65 is moved along the track 70, which may be a rail or frame system. Once the carrier 65 enters in the processing chamber 20, the isolation valve 15 closes, sealing the processing chamber 20. The carrier 65 is then moved through the processing chamber 20 for processing. In one embodiment, the carrier 65 is moved in a linear path through the chamber.

As the substrate 60 moves through the processing chamber 20, the first surface 61 of substrate 60 is repeatedly exposed to the precursor of compound A coming from gas ports 125 and the precursor of compound B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the precursors or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the first surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discrete steps.

Sufficient space is generally provided at the end of the processing chamber 20 so as to ensure complete exposure by the last gas port in the processing chamber 20. Once the substrate 60 reaches the end of the processing chamber 20 (i.e., the first surface 61 has completely been exposed to every gas port in the chamber 20), the substrate 60 returns back in a direction toward the load lock chamber 10. As the substrate 60 moves back toward the load lock chamber 10, the substrate surface may be exposed again to the precursor of compound A, the purge gas, and the precursor of compound B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are configured so as not to remove adsorbed precursors from the substrate surface 110. The width between each partition, the number of gas ports disposed on the processing chamber 20, and the number of times the substrate is passed back and forth may also determine the extent to which the substrate surface 110 is exposed to the various gases. Consequently, the quantity and quality of a deposited film may be optimized by varying the above-referenced factors.

In another embodiment, the system 100 may include a precursor injector 120 and a precursor injector 130, without a purge gas injector 140. Consequently, as the substrate 60 moves through the processing chamber 20, the substrate surface 110 will be alternately exposed to the precursor of compound A and the precursor of compound B, without being exposed to purge gas in between.

The embodiment shown in FIG. 1 has the gas distribution plate 30 above the substrate. While the embodiments have been described and shown with respect to this upright orientation, it will be understood that the inverted orientation is also possible. In that situation, the first surface 61 of the substrate 60 will face downward, while the gas flows toward the substrate will be directed upward.

In yet another embodiment, the system 100 may be configured to process a plurality of substrates. In such an embodiment, the system 100 may include a second load lock chamber (disposed at an opposite end of the load lock chamber 10) and a plurality of substrates 60. The substrates 60 may be delivered to the load lock chamber 10 and retrieved from the second load lock chamber.

In one or more embodiments, at least one radiant heat lamps 90 is positioned to heat the second side of the substrate. The radiant heat source is generally positioned on the opposite side of gas distribution plate 30 from the substrate. In these embodiments, the gas cushion plate is made from a material which allows transmission of at least some of the light from the radiant heat source. For example, the gas cushion plate can be made from quartz, allowing radiant energy from a visible light source to pass through the plate and contact the back side of the substrate and cause an increase in the temperature of the substrate.

Accordingly, in one or more embodiments, the substrate is placed into a processing chamber comprising a gas distribution plate. The gas distribution plate comprises at least one first reactive gas injector and at least one second reactive gas injector. The at least one first reactive gas injector provides a tantalum precursor to the deposition region and the at least one second reactive gas injector provides a high frequency plasma to the deposition region. The at least one first reactive gas injector being separated from the at least one second reactive gas injector by one or more vacuum ports and one or more purge gas injectors. The portion of the substrate is passed across the gas distribution plate in a first direction so that the portion of the substrate is sequentially exposed to the tantalum precursor followed by the high frequency plasma. In some embodiments, the substrate is transported in a second direction opposite the first direction to deposit additional TaN layers on the substrate.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of depositing a tantalum nitride film on a surface of a substrate, the method comprising:
    placing the substrate in a processing chamber comprising a gas distribution plate, the gas distribution plate comprising at least one first reactive gas injector and at least one second reactive gas injector, the at least one first reactive gas injector providing a tantalum precursor and the at least one second reactive gas injector providing a high frequency plasma, the at least one first reactive gas injector being separated from the at least one second reactive gas injector by one or more vacuum ports and one or more purge gas injectors; and
    passing a portion of the substrate across the gas distribution plate in a first direction so that the portion of the substrate is sequentially exposed to the tantalum precursor followed by the high frequency plasma.

2. The method of claim 1, wherein the high frequency plasma has a frequency greater than about 20 MHz.

3. The method of claim 1, wherein the high frequency plasma comprises one or more of argon, hydrogen, ammonia, helium and nitrogen.

4. The method of claim 1, wherein the high frequency plasma has a frequency of about 40 MHz.

5. The method of claim 1, wherein the high frequency plasma has a pressure in the range of about 1 Torr to about 20 Torr.

6. The method of claim 1, wherein the high frequency plasma is a capacitively coupled plasma.

7. The method of claim 1, wherein the high frequency plasma has a power in the range of about 200 watts to about 1200 watts.

8. The method of claim 1, wherein the tantalum precursor comprises one or more of pentakis(dimethylamino)tantalum (PDMAT), tantalum fluoride, tertbutylimido-tris(ethylmethylamino)tantalum (TBTEMT), tertbutylimido-tris(diethylamino)tantalum (TBTDEAT), tertbutylimido-tris(dimethylamino)tantalum (TBTDMAT), tertiaryamylimido-tris(dimethylamino)tantalum (TAIMATA), tertiaryamylimido-tris(diethylamino)tantalum, tertiaryamylimido-tris(methylethylamino)tantalum, pentakis(ethylmethylamino)tantalum (PEMAT), pentakis(diethylamido)tantalum (PDEAT), plasmas thereof, derivatives thereof, or combinations thereof.

9. The method of claim 1, wherein the tantalum precursor is pentakis(dimethylamido)tantalum (PDMAT).

10. The method of claim 1, further comprising heating the substrate to a temperature in the range of about 150° C. to about 350° C.

11. The method of claim 1, further comprising adjusting a distance between the substrate and a gas distribution plate.

12. The method of claim 11, wherein the distance between the substrate and the gas distribution plate is in the range of about 50 mil to about 800 mil.

13. The method of claim 11, wherein the distance between the substrate and the gas distribution plate is in the range of about 300 mil and about 580 mil.

14. The method of claim 1, wherein the resultant film has a lower resistivity than a similar film processed without the high frequency plasma.

15. The method of claim 1, where in the resultant film has a higher density than a similar film processed without the high frequency plasma.

* * * * *